United States Patent
Peltola et al.

[11] Patent Number: 5,590,415
[45] Date of Patent: Dec. 31, 1996

[54] METHOD AND DEVICE FOR SUPERVISING THE CONDITION OF AN ANTENNA

[75] Inventors: Jukka Peltola; Pekka Koponen, both of Oulu, Finland

[73] Assignee: Nokia Telecommunications OY, Espoo, Finland

[21] Appl. No.: 356,214

[22] PCT Filed: Apr. 13, 1994

[86] PCT No.: PCT/FI94/00138

§ 371 Date: Dec. 14, 1994

§ 102(e) Date: Dec. 14, 1994

[87] PCT Pub. No.: WO94/24576

PCT Pub. Date: Oct. 27, 1994

[30] Foreign Application Priority Data

Apr. 14, 1993 [FI] Finland ................................. 931672

[51] Int. Cl.[6] ................................................ H04B 17/00
[52] U.S. Cl. ........................... 455/115; 455/116; 455/103
[58] Field of Search .................................. 455/103, 113, 455/115, 116, 117, 119, 67.1, 67.4, 121, 123; 324/82

[56] References Cited

U.S. PATENT DOCUMENTS 3,842,358  10/1974  Frazier ....................................... 455/115
3,870,957   3/1975  Straw ........................................ 455/115

FOREIGN PATENT DOCUMENTS 0261828  3/1988  European Pat. Off. .
0165137  8/1985  Japan ........................................ 455/115
9203744  3/1992  WIPO .
9301503  1/1993  WIPO .

*Primary Examiner*—Reinhard J. Eisenzopf
*Assistant Examiner*—Thanh Le
*Attorney, Agent, or Firm*—Cushman Darby & Cushman IP Group of Pillsbury Madison & Sutro LLP

[57] ABSTRACT

A method and a device for supervising the condition of an antenna by measuring the ratio of the magnitude of a transmitted signal to the magnitude of a signal reflected from the antenna and by using, in addition to fixed alarm limits, an adjustable alarm limit, by which the condition of the transmitter device can be found out.

3 Claims, 1 Drawing Sheet

METHOD AND DEVICE FOR SUPERVISING THE CONDITION OF AN ANTENNA

BACKGROUND OF THE INVENTION

The invention relates to a method for supervising the condition of a transmitter antenna by measuring the magnitude of a signal transmitted to an antenna line and correspondingly the magnitude of a signal reflected from the antenna through the antenna line by producing a measuring signal on the basis of the ratio of the magnitude of the reflected signal to that of the transmitted signal, the measuring signal switching off the transmitter device when it exceeds a first alarm limit of a fixed level.

The invention also relates to a device for supervising the condition of a transmitter antenna, the device comprising a measuring unit for measuring the magnitude of a signal transmitted to the antenna through an antenna line and correspondingly the magnitude of a signal reflected from the antenna through the antenna line, a circuit for producing a measuring signal on the basis of the ratio of the magnitude of the reflected signal to that of the transmitted signal, an alarm indicator, and a first alarm limit of a fixed level.

An essential part of radio systems, such as mobile phone systems and their base stations, is formed by receiver and transmitter antennas, the condition of which has a direct effect on the quality of transmissions in the radio systems. The condition of antennas can be supervised, for instance, by measuring their standing-wave ratio, i.e. the electric matching of the antennas to the rest of the receiving and transmitting system. Conventionally the measuring is carried out by measuring the power supplied to the antenna line and the power reflected from the antenna through the antenna line. The meter has to be a wideband power meter, and thus the power supplied for the measurement has to be high in order for the signals received by the antenna not to interfere with the measurement. However, the use of high power usually causes distortion in electronic circuits, wherefore the measurement result is not reliable. Distortion can be reduced by various filters, but these reduce the accuracy of the measurement result. There are also solutions in which the problems described above have been solved by using as a measuring signal a measuring frequency outside the frequency band of the system and by using narrowband power measurement specifically matched to the measuring frequency.

European Patent Application No. 261 828 discloses an apparatus which measures a signal supplied from a measuring source directly to a network and a signal reflected from the network under analysis for determining the relative power. The way the apparatus analyzes the reflected and the transmitted signal is, however, a problem. For example, a sample signal extracted from the output power is applied to a measuring device over a path which is different from that of a sample signal extracted from the power reflected from the network under analysis. The fact that the signals propagate over different paths to the measuring device renders the relative value of the signals inaccurate. The inaccuracy of the relative value is caused by imperfections in the components on the signal path and inaccuracies formed during manufacture. For measurement, the measuring path must therefore always be calibrated separately by a standard signal. In practice, this means that each combination of a measuring device and an antenna with its cables would have to be calibrated by a standard signal in connection with the manufacturing process.

SUMMARY OF THE INVENTION

The object of the present invention is to improve both the supervision of the condition of antennas and the accuracy and reliability of the measuring methods, and also to enable condition supervision during use.

The method according to the invention is characterized in that a second alarm limit of an adjustable level is used, that the level of the second alarm limit is adjusted within a predetermined range until it reaches the level of the measuring signal, that when the alarm limit reaches the level of the measuring signal, the state of the alarm indicator changes, whereby the change in the state of the alarm indicator indicates the level of the measuring signal, the condition of the transmitter device being determined on the basis of the level of the measuring signal.

The device according to the invention is characterized in that the measuring unit is provided with a second alarm limit which can be set to change in a predetermined manner, that when the level of the second alarm limit reaches the level of the measuring signal, the state of the alarm indicator changes, whereby the change in the state of the alarm indicator indicates the level of the measuring signal, the condition of the transmitter device being determined on the basis of the level of the measuring signal.

An essential feature of the invention is that the transmitter unit and the transmitter antenna connected to it are supervised continuously. The power of the signal which is transmitted is compared with the power which is reflected from the antenna. Another essential feature of the invention is that the measuring arrangement can be used for supervising the condition of the transmitter circuits and the transmitter antenna, whereby the need for adjustment and maintenance can be appropriately determined on the basis of the result given by the measuring unit. Yet another essential feature is that a separate measuring signal, used only in connection with measurement, is not needed in the present arrangement but the measuring signal can be a normal signal passing through the transmitter circuits and antenna. A further feature is to use a single fixed alarm limit: when the level of the measuring signal exceeds the fixed alarm limit, an alarm is given and the transmitter circuits are switched off, wherefore the transmitter circuits are not overloaded. When a second adjustable alarm limit is used, it can be adjusted until it reaches the measuring signal formed on the basis of the ratio of the reflected power to the transmitted power. When the adjustable alarm limit reaches the level of the measuring signal, an alarm is given. However, the alarm does not cause the transmitter systems to be switched off, but from the level of the alarm limit it is possible to read a value describing the condition of the transmitter circuits and antenna.

An essential advantage of the invention is that the transmitter circuits and antenna are analyzed continuously in real time, and the operation of the apparatus is not interrupted during measurement. A further advantage is that the measuring signal is a signal that is normally transmitted in the system, wherefore a separate measuring signal is not needed, and the system does not have to be calibrated by means of a standard signal. The adjustable alarm limit renders it possible to obtain a value describing the condition of the transmitter device. Thereafter the value may be transmitted either via a radio path or through telephone lines to the maintenance point of a local maintenance company, whereafter it is decided whether the transmitter device requires local maintenance.

BRIEF DESCRIPTION OF THE DRAWINGS

In the following, the invention will be described in greater detail with reference to the accompanying drawings, in which.

DETAILED DESCRIPTION

Figure 1:
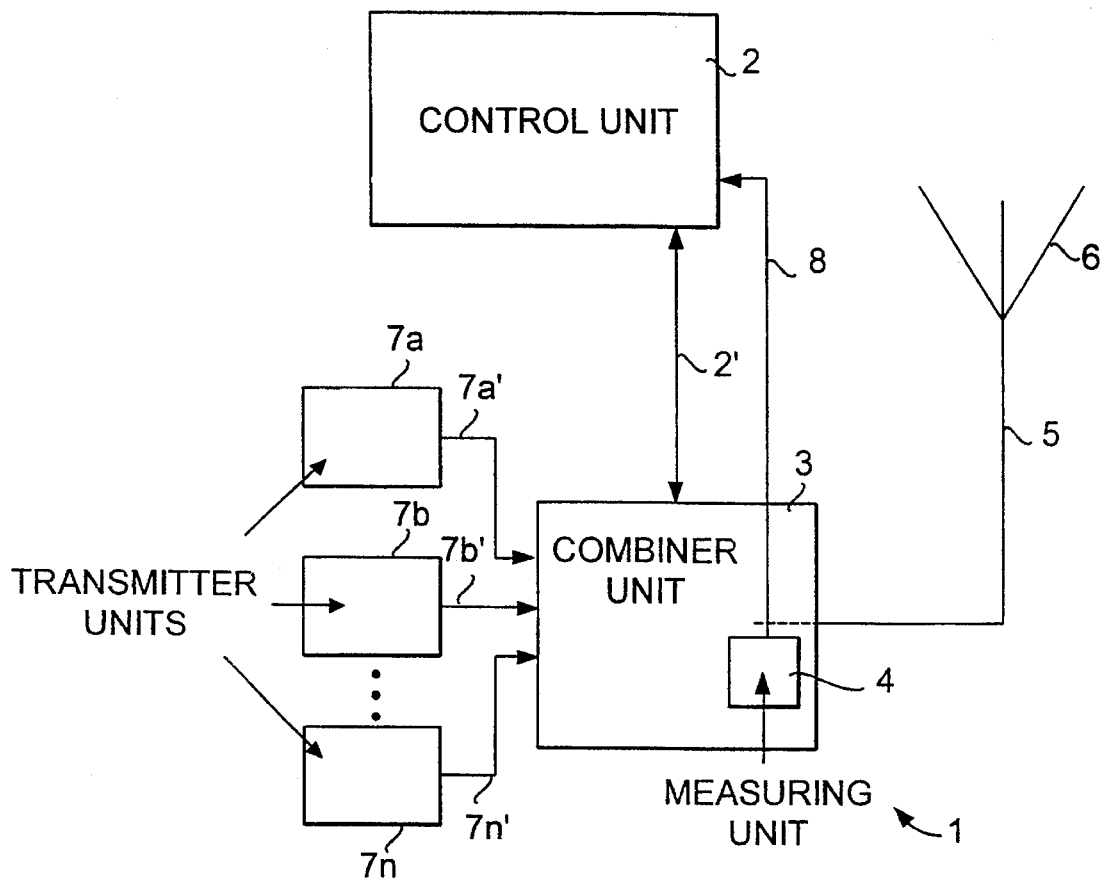
FIG. 1 is a block diagram of the device according to the invention.

FIG. 1 shows a transmitter device 1 comprising a control unit 2, a combiner unit 3, a measuring unit 4 positioned within the combiner unit 3, a transmitter antenna 6 connected to the combiner 3 via an antenna line 5, and transmitter units $7a, 7b \ldots 7n$. The control unit 2 controls the combiner 3 in order to make it combine signals supplied from the transmitter units $7a, 7b \ldots 7n$ in a suitable manner, thus preventing the amplifier units in the combiner 3 from being overloaded and ensuring that the channels remain at the disposal of predetermined transmitter units $7a, 7b \ldots 7n$. Many other functions are also included in the control unit 2, but these functions are known per se and will not be dealt with more closely in this application. The control unit 2 is connected to the combiner 3 via a bus 2', in which bidirectional data can be transmitted both from the control unit 2 to the combiner 3 and vice versa. The transmitter units $7a, 7b \ldots 7n$ are connected to the combiner 3 via a unidirectional bus $7a', 7b' \ldots 7n'$. When the combiner 3 has combined the signals supplied from the transmitter units $7a, 7b \ldots 7n$, they are supplied, after amplification, to the antenna 6, through the antenna line 5. Simultaneously, the measuring unit 4 measures the magnitude $P_f$ of the signal transmitted to the transmitter antenna 6 and, correspondingly, the magnitude $P_r$ of the signal reflected from the antenna. A measuring signal $M_s$, e.g., a standing wave ratio (SWR), which represents the quality of the transmitter system, is formed on the basis of the ration $P_r/P_f$ of the magnitudes of the reflected and transmitted signals. The signal magnitudes can be measured as an average of a certain span of time; the span of time used may be, for example, the duration of a transmission. The condition of the transmitter device 1 can be accurately deduced from the ratio of the magnitudes of the transmitted and reflected signals.

Figure 2:
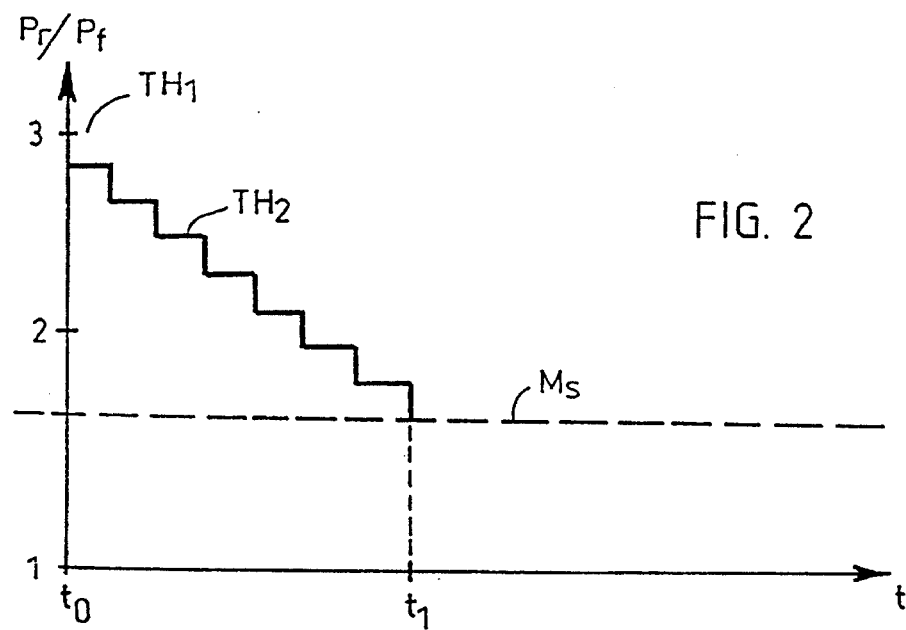
FIG. 2 illustrates the changing of the adjustable alarm limit according to the invention in time domain.

The use of alarm limits $TH_1$ and $TH_2$ is illustrated in FIG. 2. When the SWR value of the measuring signal $M_s$ is one, the system is optimally tuned, and no power is reflected from the antenna 6 to the measuring unit 4 of the combiner 3. Correspondingly, when the SWR value of the measuring signal $M_s$ is three, i.e. when it exceeds the fixed alarm limit $TH_1$, the system is already in such a bad condition that the measuring unit gives an alarm to the control unit 2 (at 8 in FIG. 1), which switches off the separate transmitter and amplifier units. The measuring unit 4 also comprises an adjustable alarm limit $TH_2$. Starting from the value describing the worst condition of the system, i.e. three, at a point of time $t_0$, the alarm limit $TH_2$ is adjusted step by step or continuously downwards until it gives an alarm after having reached the SWR value of the measuring signal $M_s$ at a point of time $t_1$. This value of the adjustable alarm limit $TH_2$ thus indicates the SWR value of the measuring signal $M_s$ and may vary between one and three, wherefore it gives a more accurate view of the condition of the system. From the value of the adjustable alarm limit $TH_2$ it can be deduced when the transmitter station requires local maintenance and tuning.

The figures and the description pertaining to them are intended merely to illustrate the inventive concept. In its details the invention may vary within the scope of the appended claims.

We claim:

1. A transmitter antenna diagnostic method, comprising the steps of:

providing a first fixed alarm limit;

transmitting a signal from a transmitter device to an antenna line to an antenna, whereby a portion is reflected from the antenna through the antenna line;

measuring the magnitude of said signal;

measuring the magnitude of said reflected portion of said signal;

providing a measuring signal related to the measured magnitudes of said reflected signal and said transmitted signal, a level of said measuring signal representing a condition of the antenna;

determining said level of said measuring signal by:
a) providing a second alarm limit having an adjustable level,
b) setting said adjustable level of said second alarm limit at a preset level,
c) adjusting said level of the second alarm limit from said present level until said adjustable level reaches said level of said measuring signal,
d) indicating the level of said second alarm limit reaching said level of said measuring signal,
e) determining said level of said measuring signal to be equal to said indicated level of said second alarm limit, and
f) determining a condition of said antenna on the basis of said determined level of said measuring signal; and switching-off said transmitter device when said level of said measuring signal exceeds said first fixed alarm limit.

2. A method according to claim 1, further comprising a step of:

adjusting the level of the second alarm limit by predetermined steps.

3. A device for supervising the condition of a transmitter antenna, said device comprising:

a measuring unit for measuring the magnitude of a signal transmitted to the antenna through an antenna line and the magnitude of a signal reflected from the antenna through the antenna line;

a circuit for providing a measuring signal on the basis of the measured magnitudes of the reflected signal and said transmitted signal, a level of said measuring signal representing a condition of the antenna;

a first alarm limit of a fixed level;

an adjustable second alarm limit;

said measuring unit being arranged to adjust the level of the second alarm limit from said first alarm limit by predetermined steps until said second alarm limit reaches said level of the measuring signal; and said measuring unit being arranged to indicate the level of said second alarm limit reaching said level of said measuring signal, and to thereby indicate said level of said measuring signal for further analyzation of the condition of said antenna.

* * * * *